United States Patent
Maus et al.

(10) Patent No.: US 12,405,296 B2
(45) Date of Patent: Sep. 2, 2025

(54) ELECTRIC FIELD DETECTOR WEARABLE IN MULTIPLE ORIENTATIONS

(71) Applicant: Emerson Professional Tools, Inc., Elyria, OH (US)

(72) Inventors: Sabrina Maus, Loves Park, IL (US); Kristofer Mirjanic, Gilberts, IL (US); William John McNulty, Chicago, IL (US)

(73) Assignee: Emerson Professional Tools, Inc., Elyria, OH (US)

( * ) Notice: Subject to any disclaimer, the term of this patent is extended or adjusted under 35 U.S.C. 154(b) by 314 days.

(21) Appl. No.: 18/315,613

(22) Filed: May 11, 2023

(65) Prior Publication Data

US 2023/0366919 A1   Nov. 16, 2023

Related U.S. Application Data (60) Provisional application No. 63/342,046, filed on May 13, 2022.

(51) Int. Cl.

| | |
|---|---|
| *G01R 29/12* | (2006.01) |
| *G01R 1/04* | (2006.01) |
| *G01R 15/14* | (2006.01) |

(52) U.S. Cl.
    CPC ............. *G01R 29/12* (2013.01); *G01R 15/14* (2013.01); *G01R 1/04* (2013.01)

(58) Field of Classification Search
    CPC .... G01R 29/00; G01R 29/08; G01R 29/0807; G01R 29/0814; G01R 29/0857;

(Continued)

(56) References Cited

U.S. PATENT DOCUMENTS

| | | |
|---|---|---|
| 5,168,265 A | 12/1992 | Aslan |
| 6,788,215 B1 | 9/2004 | White |

(Continued)

FOREIGN PATENT DOCUMENTS

| | | | |
|---|---|---|---|
| AU | 2007347134 A2 * | 4/2009 | ......... G01R 29/0814 |
| CN | 107518487 A | 12/2017 | |

(Continued)

OTHER PUBLICATIONS

Extended European Search Report for EP23172816.3 dated Sep. 19, 2023.

(Continued)

*Primary Examiner* — Hoai-An D. Nguyen
(74) *Attorney, Agent, or Firm* — Klintworth & Rozenblat LLP (57) ABSTRACT

A wearable electric field detector is configured to detect an electric field generated by a high-voltage electrical source in an environment, and includes a first antenna, a second antenna, an electrical circuit board operatively coupled to the first antenna and the second antenna, a power source coupled to the circuit board, and a plurality of indicators operatively coupled to the circuit board. The first antenna and second antenna are mounted perpendicular to the circuit board. The detector provides an alert to the user indicative of a strength of a detected electric field. An enclosure houses the first antenna, the second antenna, the circuit board, the power source, and the indicators. The enclosure may be worn by the user in a vertical orientation, a horizontal orientation, and in an orientation disposed between the vertical orientation and the horizontal orientation.

19 Claims, 5 Drawing Sheets

(58) Field of Classification Search
CPC . G01R 29/12; G01R 1/00; G01R 1/02; G01R 1/04; G01R 15/00; G01R 15/14; G08B 21/00
USPC .......................................................... 324/457
See application file for complete search history.

(56) References Cited

U.S. PATENT DOCUMENTS

| | | |
|---|---|---|
| 9,658,265 B2 | 5/2017 | Hoffman et al. |
| D792,252 S | 7/2017 | Garner |
| 10,091,897 B2 | 10/2018 | Filson et al. |
| 10,802,065 B2 | 10/2020 | Mcnulty et al. |
| 10,877,081 B2 | 12/2020 | Mcnulty et al. |
| 10,891,848 B2 | 1/2021 | Mcnulty et al. |
| 2018/0164350 A1 | 6/2018 | Thompson et al. |
| 2021/0270873 A1 | 9/2021 | Thompson et al. |

FOREIGN PATENT DOCUMENTS

| | | | | |
|---|---|---|---|---|
| CN | 107647516 A | | 2/2018 | |
| CN | 219780645 U | | 9/2023 | |
| JP | 2004056484 A | * | 2/2004 | ............... H01Q 1/24 |
| JP | 2004235971 A | * | 8/2004 | ............... H01Q 1/24 |

OTHER PUBLICATIONS

Safeguard, Compass Pro, https://www.safeguardequipment.com/ipmag/compass-pro/, copyright 2018.
Compass Pro product https://web.archive.org/web/20221027130257/https://www.safeguardequipment.com/wp-content/uploads/2022/10/COMPASS-PRO-Product-Specs-White-Paper.pdf Wayback machine capture Oct. 27, 2022 of the undated whitepaper.
Compass product User guide dated May 31, 2022.
Office Action issued for European patent application No. EP23172816.3 dated Feb. 4, 2025, 04 pages.

* cited by examiner

ELECTRIC FIELD DETECTOR WEARABLE IN MULTIPLE ORIENTATIONS

CROSS-REFERENCE TO RELATED APPLICATION

This application claims the priority of U.S. provisional application Ser. No. 63/342,046, filed on May 13, 2022, the contents of which are incorporated herein in its entirety.

TECHNICAL FIELD

The present disclosure generally relates to a wearable electric field detector that warns the user of proximity to nearby high-voltage conductors.

BACKGROUND

Reliably detecting high-voltages on distribution and transmission power lines is critical to the jobs performed by electric utility line workers. When these jobs are performed, an electric field detector adds additional safety and is also convenient and easy to use.

SUMMARY

In one specific embodiment, a wearable electric field detector is provided. The wearable electric field detector is configured to be worn by a wearer or user in an environment where a potentially dangerous high-voltage electrical source is present.

A wearable electric field detector is configured to detect an electric field generated by a high-voltage electrical source in an environment, and includes a first antenna, a second antenna, and electrical circuit board operatively coupled to the first antenna and the second antenna, a power source coupled to the circuit board, and a plurality of indicators operatively coupled to the circuit board. The first and second antennas are mounted perpendicular to the electrical circuit board and are space apart from each other in a lateral direction. The detector provides an alert to the user indicative of a strength and general direction of a detected electric field. An enclosure houses the first antenna, the second antenna, the circuit board, the power source, and the indicators. The enclosure may be worn by the user in a vertical orientation, a horizontal orientation, or in an orientation disposed angularly between the vertical orientation and the horizontal orientation (a tilted orientation).

This summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages of various disclosed embodiments will become apparent from the following detailed description taken in conjunction with the accompanying drawings, which illustrate, by way of example, the principles of the described embodiments.

BRIEF DESCRIPTION OF THE DRAWINGS

The system may be better understood with reference to the following drawings and the description. The components in the figures are not necessarily to scale, emphasis instead being placed upon illustrating the principles disclosed. Moreover, in the figures, like-referenced numerals designate corresponding parts throughout the different views.

DETAILED DESCRIPTION

While this disclosure may be susceptible to embodiment in different forms, there is shown in the drawings, and herein will be described in detail, a specific embodiment with the understanding that the present disclosure is to be considered an exemplification of the principles of the disclosure, and is not intended to limit the disclosure to that as illustrated and described herein. Therefore, unless otherwise noted, features disclosed herein may be combined together to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure.

Figure 1:
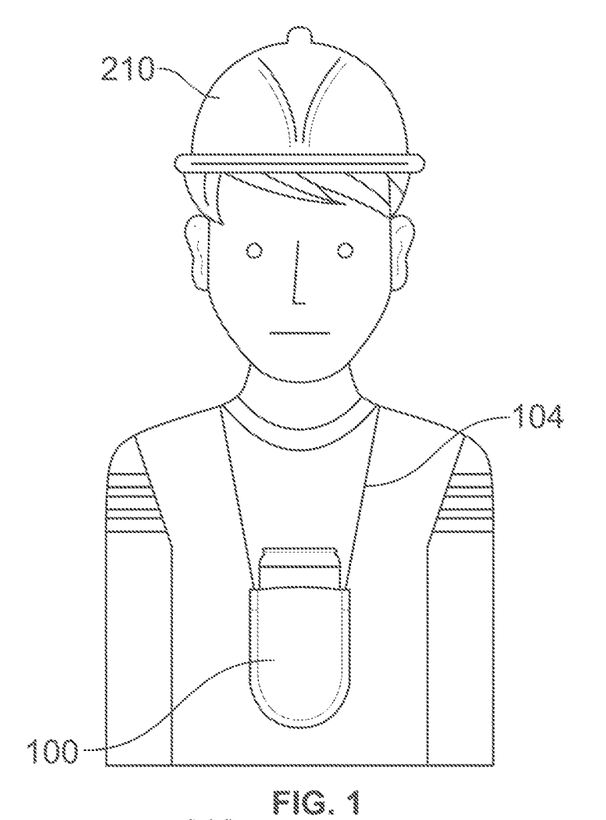
FIG. 1 is an illustration showing a known detector worn in a mid-torso worn orientation.

FIG. 1 illustrates a known detector 100 shown in a torso-worn or vertical position, which detector may be secured about the user's neck by a lanyard 104 for convenience. However, such known detectors are designed to properly detect dangerous electric fields only when worn in a vertical position as shown. Such known detectors lose sensitivity and accuracy if not worn in the vertical position.

The present disclosure relates to electric field detection, and more particularly to a wearable electric field detector 200 configured to detect such electric fields, which are typically high-voltage electric fields. The wearable electric field detector 200 is designed to provide an early warning to the wearer of the proximity to nearby high-voltage conductors that generate the electric field. In some embodiments, the high-voltage conductors are alternating current (AC) conductors, thus high-voltage AC electric fields are generated.

Figure 2A:
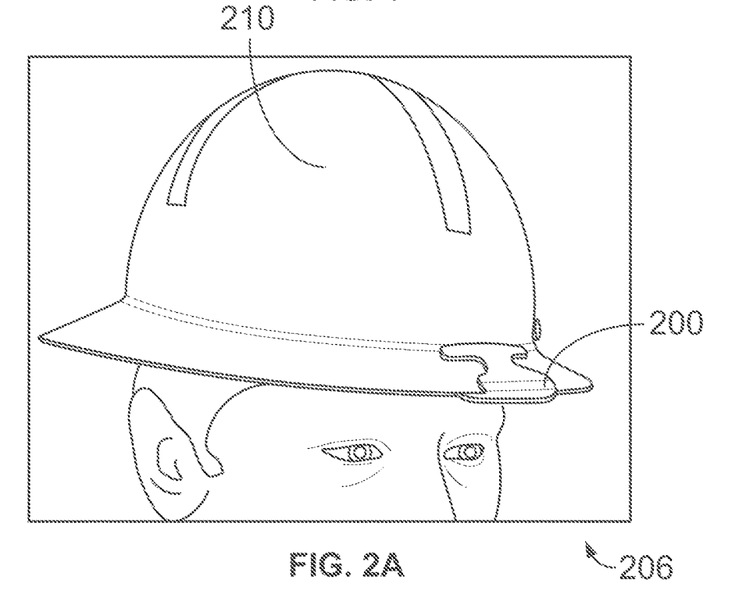
FIG. 2A illustrates an electric field detection device worn in a hard-hat mounted orientation, according to one embodiment.
Figure 2B:
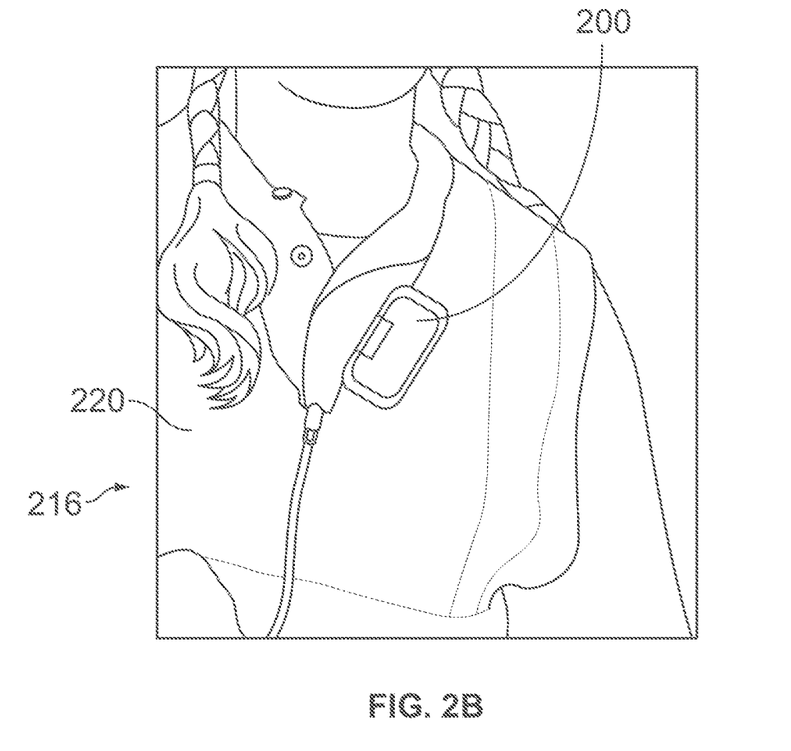
FIG. 2B illustrates an electric field detection device worn in a torso-mounted orientation, according to one embodiment

It is desirable to be able to wear an electric field detector in any position while maintaining adequate accuracy and sensitivity in such multiple positions. FIG. 2A shows an embodiment of the present invention that permits a user to wear the electric field detector 200 in a generally horizontal orientation 206 clipped to or otherwise fastened to a hard hat 210. FIG. 2B shows an embodiment that permits the user to wear the electric field detector 200 in orientation disposed angularly between the vertical orientation and the horizontal orientation 216, where the electric field detector 200 may also be clipped to an article of clothing 220. The electric field detector 200 may also be worn in a vertical orientation secured about the user's neck by a lanyard for convenience.

Figure 3:
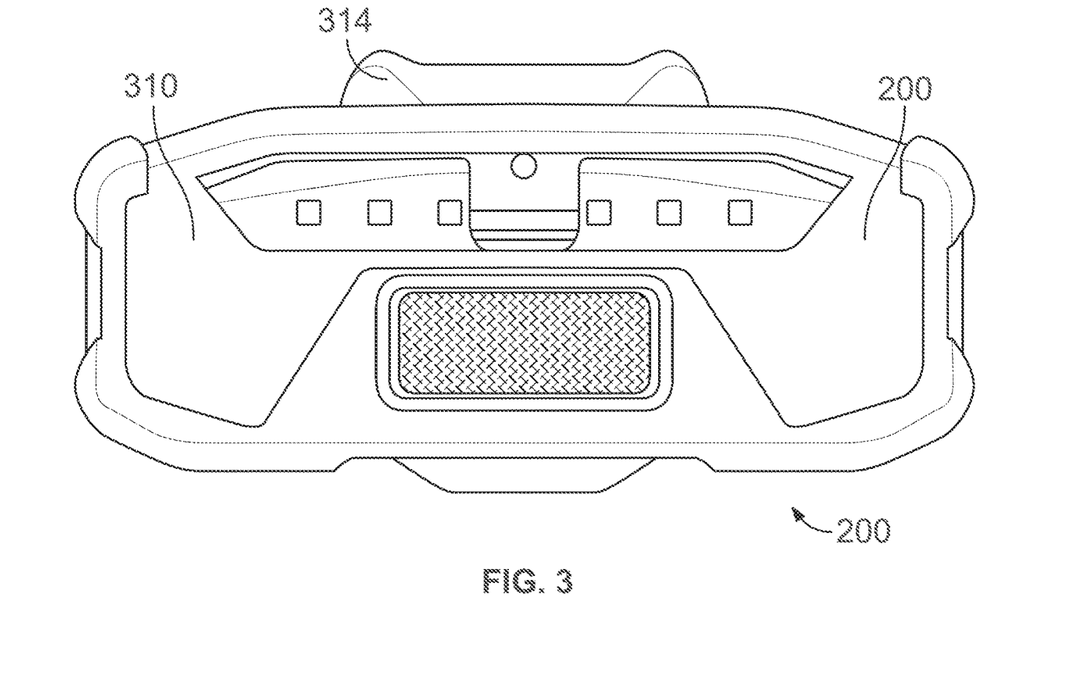
FIG. 3 shows the electric field detector housing, according to one embodiment.
Figure 4:
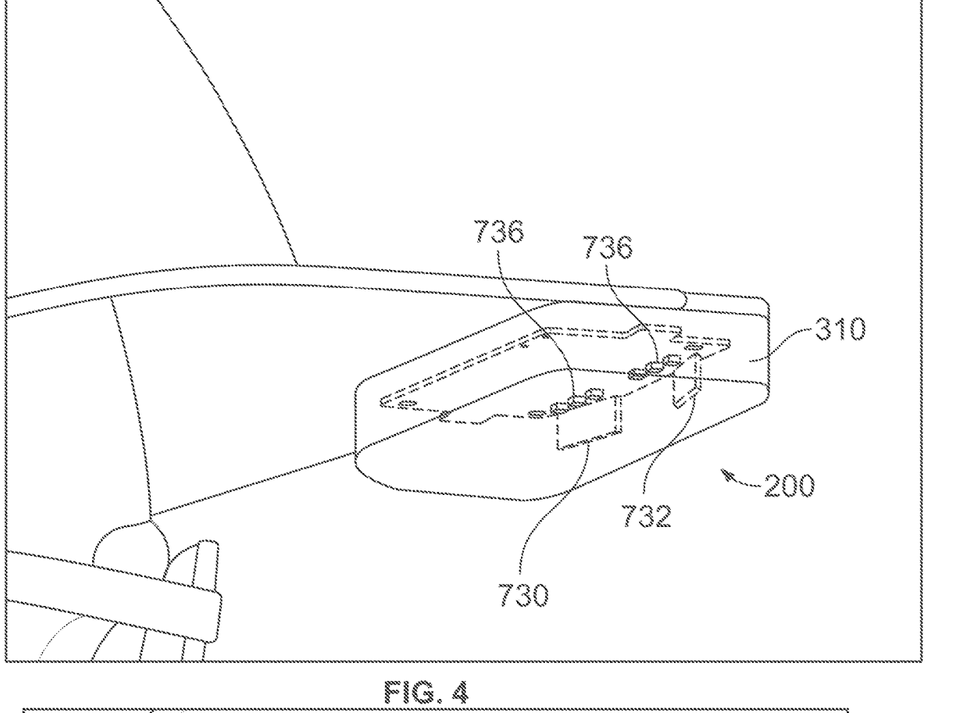
FIGS. 4-6 show the electric field detector housing in translucent form to expose certain internal components, according to one embodiment.
Figure 5:
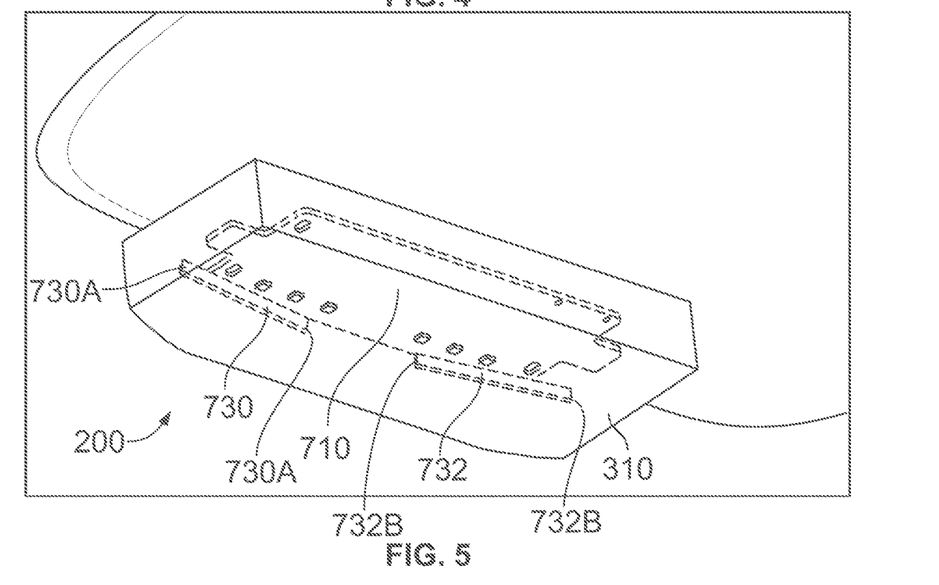
Figure 6:
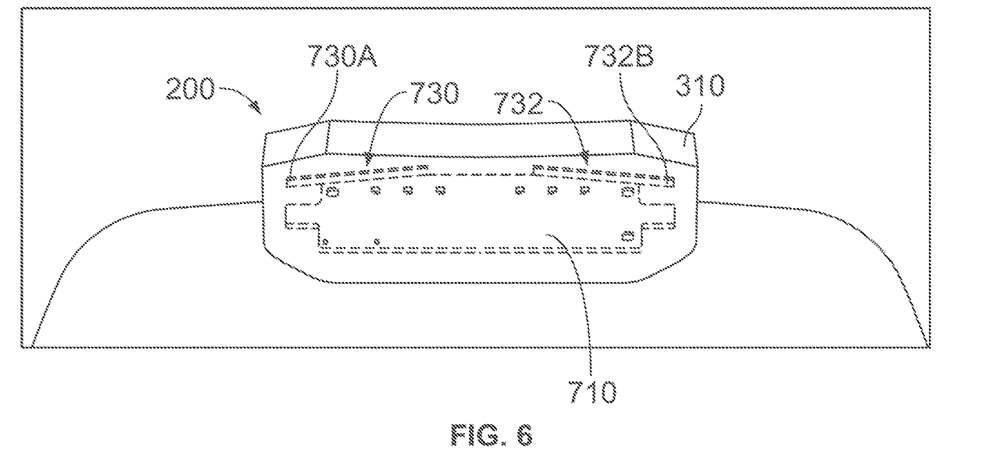

FIG. 3 shows an electric field detector housing or plastic shell 310, that may include a spring-loaded clip 314 to permit attachment to the brim of the hard hat 210. FIG. 4 also shows the housing or plastic shell 310 worn in the horizontal position, typically clipped to the brim of the hard had 210. FIGS. 5-6 are top perspective views of the housing or plastic shell 310.

Figure 7:
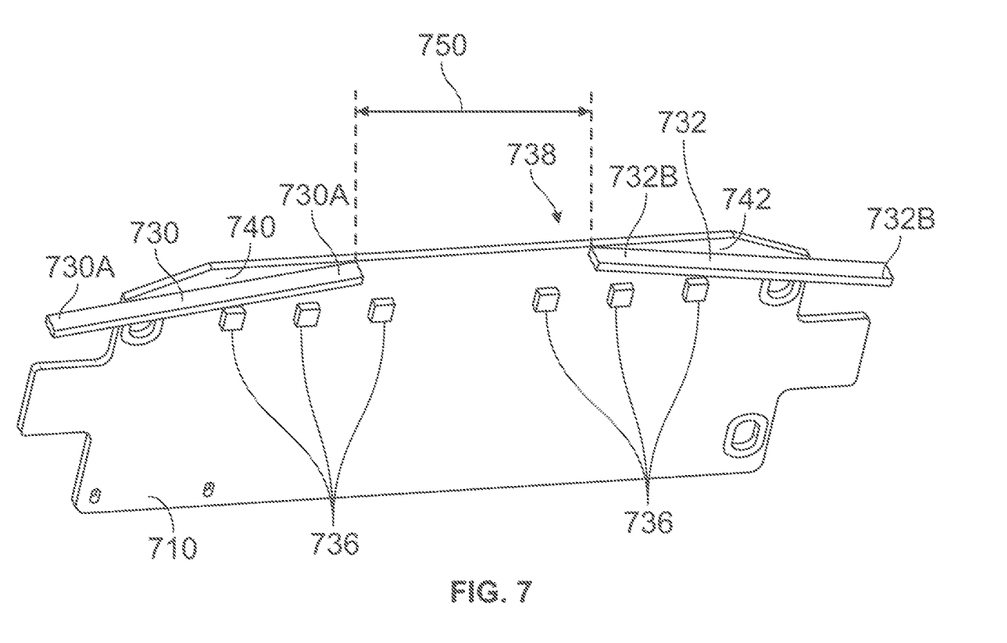
FIG. 7 illustrates a PC board, with a first antenna and a second antenna, according to one embodiment.

FIG. 7 shows certain components of the electric field detector 200 contained within the housing or plastic shell 310. The housing or plastic shell 310 fixedly mounts a printed circuit board 710, a first or left-hand antenna 730 and a second or right-hand antenna 732. A distal end 730A of the first or left-hand antenna 730 may extend past or overhang the left-hand edge of the printed circuit board 710. Similarly, a distal end 732b of the second or right-hand antenna 732 may extend past or overhang the right-hand edge of the printed circuit board 710. The antennas 730, 730 generally extend laterally across a forward edge 738 of the printed circuit board 710, which forward edge is preferably a continuous edge.

Note that the dimensions of the first and second antennas 730, 732 are not necessarily drawn to scale in FIG. 7. The first antenna 730 and second antenna 732 may be mounted to the printed circuit board 710 directly, and are preferably positioned perpendicular to the printed circuit board 710. Additional metallic pad portions 740, 742 may be disposed on a peripheral forward edge of the printed circuit board 710 adjacent the first antenna 730 and the second antenna 732, respectively, to increase sensitivity of the antennas. The metallic pad portions 740, 742 may be disposed proximal one of the antennas 730, 732 or both of the antennas 730, 732 and are preferably formed as part of the metal trace structure of the printed circuit board 710.

The corresponding pad portions 740, 742 may be coupled to the first antenna 730 and to the second antenna 732 respectively by any suitable means, such as by PC trace metal, discrete wiring, soldered connection, or other suitable methods. Preferably, the sensitivity and gain of the first and second antennas 730, 732 are similar or substantially equal whether worn in the vertical or horizontal orientation, or at an angular orientation between vertical and horizontal.

The first antenna 730 and the second antenna 732 are preferably planar antennas, and may be separated from each other by a predetermined lateral distance or width across the printed circuit board 710. In another embodiment, the first and second antennas 730, 732 may be curved or arched in a plane perpendicular to the printed circuit board 710. In a further embodiment, the first antenna 730 and second antenna 732 may be combined as a single upstanding antenna rather than two separate antennas.

In the embodiment having two separate antennas, namely the first antenna 730 and the second antenna 732, due to the preferred physical separation therebetween, each antenna 730, 732 may detect a slightly different electrical field strength. This small difference in received electrical field strength may provide directionality of the detected electric field based on the measured signal strength at each respective antenna 730, 732.

A power source, such as a battery 810 (see FIG. 8), provides power to the printed circuit board 710 to power the various electrical components. Further, a plurality of indicators may be operatively coupled to the circuit board, which may be configured to provide an alert to the user indicative of a strength of a detected electric field and/or proximity thereto. In one embodiment, the indicators may include a plurality of LEDs 736, which are visible to the user through the translucent housing or plastic shell 310. Such LEDs 736 provide a convenient and ergonomically correct visual indicator to the user, particularly when the electric field detector 200 is worn in the horizontal or hard hat mounted position. Due to the separation of the first or left-side antenna 730 from the second or right-side antenna 732, as described above, the directionality of the detected electrical field may be determined generally.

In one specific embodiment, the first antenna 730 is in-line with the second antenna 732, although spaced apart toward opposite sides of the printed circuit board 710. For example, the distance 750 between inner-most edges of the first and second antennas 730, 732, which define the separation, may be about equal to about one-half of the length of either antenna 730, 732. In other embodiments, the distance between inner-most edges of the first and second antennas 730, 732 may range between about one-fifth of the length of either antenna 730, 732 to about twice the length of either antenna.

In another specific embodiment, each antenna 730, 732 may be angled away from each other to improve directionality determinations. Preferably, the first antenna 730 may be angled away from the second antenna 732 by an angle of between zero degrees and 30 degrees. Although not drawn to scale, FIG. 7 illustrates that the first antenna 730 may angled away from the second antenna 730 by an undisclosed angle.

To convey directionality of the electrical field generally relative to the user, the LEDs 736 may be illuminated sequentially and periodically to give the illusion of movement of the LEDs in a particular direction. This may provide the user with an indication, either leftward of the user, or rightward of the user, of the location of the detected electric field.

Further, another indicator of the plurality of indicators may include an audio output device 814 such as an audio transducer or speaker (see FIG. 8) configured to produce an audio warning tone or series of sounds to the user. The volume, frequency, or repetition rate of the audio output device 814 may provide the user with an indication of the proximity to, and hence a possible danger level of the detected electrical field. The audio transducer 814 may beep at a first rate when the detected electric field exceeds a first threshold. Then, when the electric field exceeds a second threshold, the audio transducer 814 may beep at a second rate, which is greater than the first rate. Further, when the electric field exceeds a third threshold, the audio transducer 814 may beep at a third rate, which is greater than the second rate. This provides a stepped level of alerts to indicated a progressively dangerous detected electric field.

Similar to the audio transducer 814, the LEDs 736 may also be capable of indicating field strength and proximity in addition to directionality. There may be the same three thresholds for the electric field with corresponding LED blinking rates. In other words, when the measured electric field strength increases, the LEDs blink faster and the sound beeps faster indicating that the electric field detector 200 is in closer proximity to the source of the electric field.

Figure 8:
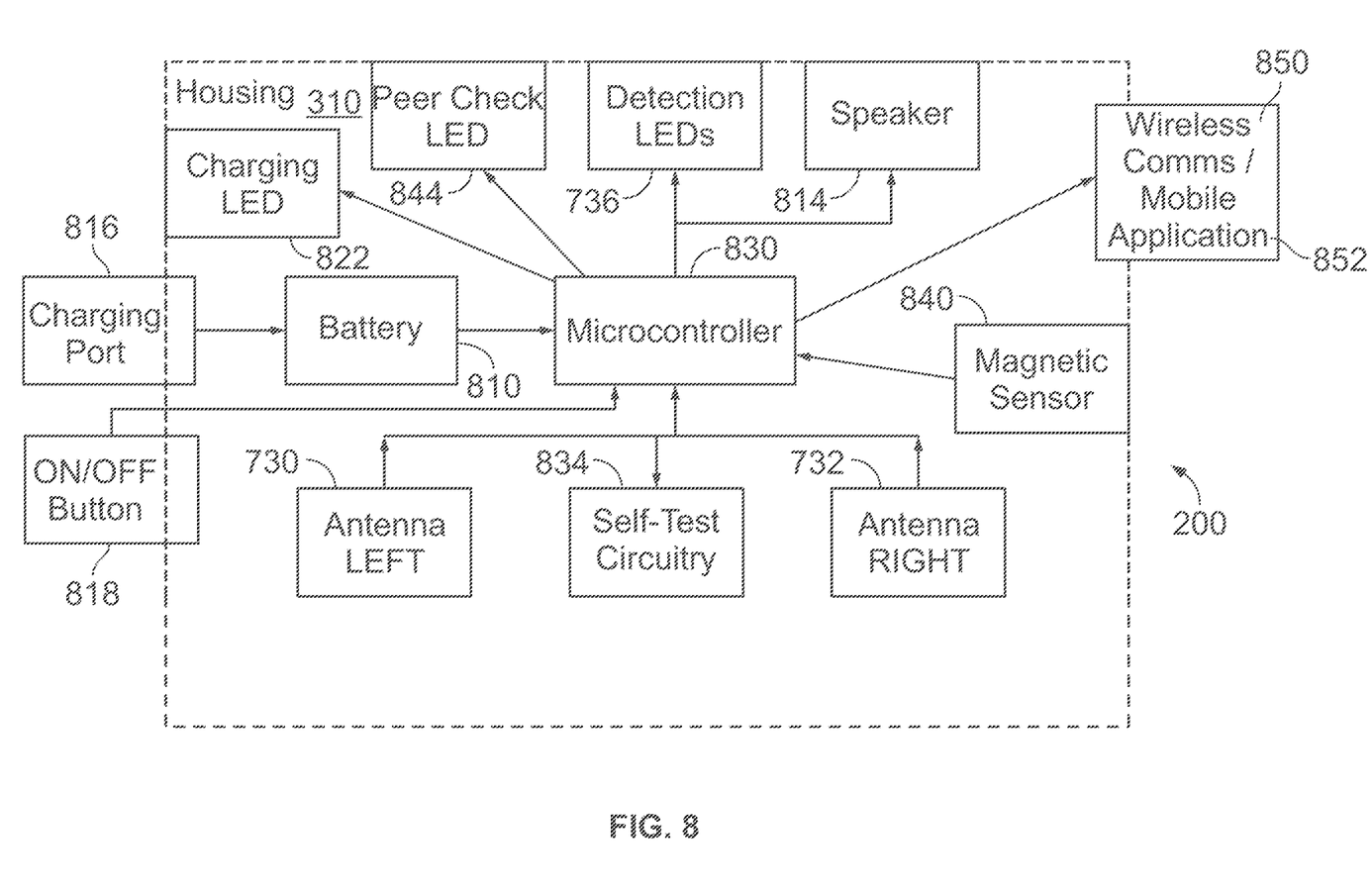
FIG. 8 is an electrical block diagram, according to one embodiment.

FIG. 8 is an electrical block diagram. As described above, the electric field detector 200 includes a battery 810, which is preferably rechargeable via a charging port interface 816 and charging device (not shown) configured to charge the battery 810. A power switch 818 activates and deactivates the electric field detector 200. When the battery 810 is charging, a charging light 822 may be illuminated to indicate charging status.

A microprocessor or other general purpose controller 830 provides control and operation of the electric field detector 200, including input/output functions for the LEDs 736, audio transducer 814, charging light 822 and the like.

A self-test circuit 834 may also be provided, which performs a voltage detection system test of the wearable electric field detector 200. The self-test circuit 834 may send signals to the first and second antennas 730, 732 to determine if certain electrical paths are complete and unbroken. The self-test circuit 834 may also perform an assessment of the voltage detection system to ensure that the proper level of various voltage signals is received. Further, the self-test circuit 834 may check the battery level of battery 810. Successful completion of the various tests performed may be confirmed by emitting a turn-on audio tone from the audio transducer 814 and/or by activating the LEDs 736.

In some embodiments, a magnetic sensor 840 may provide an indication of the measured magnetic field, in addition to the electric field. The self-test circuit 834 may also verify that the magnetic sensor 840 is functioning properly. A peer-check indicator 844 may be in the form of a periodically blinking LED to indicate to others around the user that the electric field detector 200 is turned ON and is in the detection mode. If the peer-check indicator 844 is not blinking, then the others nearby can notify the user that the electric field detector 200 is not operational. The electric field detector 200 may also communicate externally via a wireless communications circuit 850 and corresponding wireless communication application 852.

The electric field detector 200 may have the function to be able to mute the audible signals while the LEDs still indicate a nearby electric field with blinking visual indicators, as a convenience to the user. To temporarily mute the audible signals, the user may actuate the power button with a quick press. This would only mute the audible signals if the field has already been detected. There may be a time limit for the mute function operation whereby the audible signals will begin to alert/sound again after the time limit has expired. The user may then again actuate the power button quickly to mute the audible signals.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

We claim:

1. A wearable electric field detector configured to detect an electric field generated by a high-voltage electric source in an environment, the detector comprising:
   a first and second antenna;
   an electrical circuit board operatively coupled to the first antenna and the second antenna, wherein the first and second antennas are mounted perpendicular to the electrical circuit board;
   a power source operatively coupled to the electrical circuit board;
   a plurality of indicators operatively coupled to the electrical circuit board and configured to provide an alert to the user indicative of a strength of a detected electric field;
   an enclosure configured to house the first antenna, the second antenna, the electrical circuit board, the power source, and the indicators;
   wherein:
   the enclosure is configured to be worn by the user in a vertical orientation, a horizontal orientation, or in an orientation disposed between the vertical orientation and the horizontal orientation; and
   the first antenna and the second antenna are spaced apart toward opposite sides of the electrical circuit board, wherein metallic pad portions are disposed on a peripheral forward edge of the electrical circuit board adjacent the first antenna and the second antenna, respectively, to increase sensitivity of the antennas and that the metallic pad portions are disposed proximal one of the antennas or both of the antennas and are formed as part of a metal trace structure of the electrical circuit board.

2. The detector according to claim 1, wherein a direction of the electric field relative to the user is indicated to the user by the plurality of indicators.

3. The detector according to claim 1, wherein the vertical orientation of the enclosure is a torso-worn orientation and the horizontal orientation of the enclosure is a hard-hat worn orientation.

4. The detector according to claim 1, wherein first antenna and the second antenna are planar antennas.

5. The detector according to claim 1, wherein the detector detects a horizontal electric field and a vertical electric field, and determines an electric field signal strength of the horizontal electric field and an electric field strength of the vertical electric field.

6. The detector according to claim 1, wherein multiple levels of audio alert are provided to the user to indicate a range of distances from the user to the detected electric field.

7. The detector according to claim 1, wherein the first antenna and the second antenna are disposed on opposite lateral sides of the electrical circuit board, separated from each other by a predetermined lateral distance.

8. The detector according to claim 1, wherein the first antenna and the second antenna provide directionality of the detected electric field based on measured signal strength at each respective antenna.

9. The detector according to claim 8, wherein directionality is provided when worn in a hard hat mounted position.

10. The detector according to claim 1, wherein the plurality of indicators include a row of visual indicators visible to the user, and wherein sequential illumination of the visual indicators in the row provides the user with an indication of a direction of the detected electric field relative to the user.

11. The detector according to claim 1, wherein the plurality of indicators include an audio indicator.

12. The detector according to claim 1, wherein the plurality of indicators include a row of visual indicators visible to the user and configured to provide the user with an indication of electric field strength.

13. The detector according to claim 12, wherein the visual indicators blink at a first rate when the electric field strength exceeds a first threshold, and the visual indicators blink at a second rate when the electric field strength exceeds a second threshold, wherein the second threshold is greater than the first threshold and the second rate is greater than the first rate.

14. The detector according to claim 13, wherein the visual indicators blink at a third rate when the electric field strength exceeds a third threshold, wherein the third threshold is greater than the second threshold and the third rate is greater than the second rate.

15. A wearable electric field detector configured to detect an electric field generated by a high-voltage electric source in an environment, the detector comprising:
a first and second antenna;
an electrical circuit board operatively coupled to the first antenna and the second antenna, wherein:
the first and second antennas are mounted perpendicular to the electrical circuit board;
the first and second antennas are separated from each other by a predetermined distance;
the first and second antenna extend laterally across a forward edge of the electrical circuit board;
a plurality of indicators operatively coupled to the electrical circuit board and configured to provide an alert to the user indicative of a strength of a detected electric field;
an enclosure configured to house the first antenna, the second antenna, the electrical circuit board, a power source, and the indicators;
wherein:
the enclosure is configured to be worn by the user in a vertical orientation, a horizontal orientation, or in an orientation disposed between the vertical orientation and the horizontal orientation; and
the first antenna and the second antenna are spaced apart toward opposite sides of the electrical circuit board, wherein metallic pad portions are disposed on a peripheral forward edge of the electrical circuit board adjacent the first antenna and the second antenna, respectively, to increase sensitivity of the antennas and that the metallic pad portions are disposed proximal one of the antennas or both of the antennas and are formed as part of a metal trace structure of the electrical circuit board.

16. The detector of claim 15, wherein the first antenna and the second antenna provide directionality of the detected electric field based on a measured signal strength at each respective antenna.

17. The detector of claim 15, wherein the predetermined distance defines a distance between inner-most edges of the first and second antennas, and wherein the predetermined distance is between one-fifth of a length of either antenna to twice the length of either antenna.

18. The detector of claim 15, wherein the first antenna is angled away from the second antenna by an angle of between zero degrees and 30 degrees.

19. A wearable electric field detector configured to detect an electric field generated by a high-voltage electric source in an environment, the detector comprising:
a first and second antenna;
an electrical circuit board operatively coupled to the first antenna and the second antenna, wherein:
the first and second antennas are mounted perpendicular to the electrical circuit board;
the first and second antennas are separated from each other by a predetermined distance;
the first and second antennas extend laterally across a forward portion of the electrical circuit board;
the first antenna is angled away from the second antenna by a predetermined angle;
a plurality of indicators operatively coupled to the electrical circuit board and configured to provide an alert to the user indicative of a strength of a detected electric field;
an enclosure configured to house the first antenna, the second antenna, the electrical circuit board, a power source, and the indicators;
wherein:
the enclosure is configured to be worn by the user in a vertical orientation, a horizontal orientation, or in an orientation disposed between the vertical orientation and the horizontal orientation; and
the first antenna and the second antenna are spaced apart toward opposite sides of the electrical circuit board, wherein metallic pad portions are disposed on a peripheral forward edge of the electrical circuit board adjacent the first antenna and the second antenna, respectively, to increase sensitivity of the antennas and that the metallic pad portions are disposed proximal one of the antennas or both of the antennas and are formed as part of a metal trace structure of the electrical circuit board.

* * * * *